United States Patent [19]

Jordan

[11] Patent Number: 5,192,922
[45] Date of Patent: Mar. 9, 1993

[54] ANTI-FALSE TRIGGERING SYSTEM FOR A PULSE WIDTH MODULATION SYSTEM

[75] Inventor: Edward P. Jordan, Greensboro, N.C.

[73] Assignee: Analog Devices, Inc., Norwood, Mass.

[21] Appl. No.: 890,951

[22] Filed: May 29, 1992

[51] Int. Cl.$^5$ .............................. H03K 7/00
[52] U.S. Cl. ................................ 332/109; 375/22; 307/265
[58] Field of Search .............. 332/109, 110, 111; 375/22; 328/58, 111, 112; 307/265, 266, 267

[56] References Cited

U.S. PATENT DOCUMENTS

| | | | |
|---|---|---|---|
| 4,891,828 | 1/1990 | Kawazoe | 307/265 X |
| 5,045,800 | 9/1991 | Kung | 307/265 X |
| 5,119,045 | 6/1992 | Sato | 332/109 |

Primary Examiner—Siegfried H. Grimm
Attorney, Agent, or Firm—Iandiorio & Dingman

[57] ABSTRACT

An anti-false triggering system for a pulse width modulation system includes a ramp generator for generating a ramp signal having a ramp portion and a rest portion; a latch enable signal generator for providing a latch enable signal only during the ramp portion of the ramp signal; and a pulse edge modulator responsive to the ramp portion of the ramp signal for providing a pulse with at least one of its edges modulated, the pulse edge modulator being enabled by the latch enable signal only during the ramp portion of the ramp signal for suppressing false triggering of the pulse edge modulator during the rest portion of the ramp signal.

13 Claims, 6 Drawing Sheets ated in the circuit of FIG. 1 when using two ramps to gener-
ANTI-FALSE TRIGGERING SYSTEM FOR A PULSE WIDTH MODULATION SYSTEM

FIELD OF INVENTION

An anti-false triggering system for a pulse width modulation system, and more particularly to such an anti-false triggering system which assures that pulse generation occurs only during the ramp portion of the ramp signal from which pulses are derived.

BACKGROUND OF INVENTION

Conventional pulse width modulation circuits often use comparators to define the leading edge, trailing edge or both edges of a desired pulse with reference to a ramp. One or both of the edges are thus defined by the comparator, whose output is then used to operate a latch or flip-flop circuit to produce a pulse whose width is modulated to the desired size. The three modes of modulation are denominated leading edge modulation (LEM), trailing edge modulation (TEM) and dual edge modulation (DEM). One problem that occurs is false triggering of the pulse-producing flip-flop when the ramp signal resets from the ramp portion to the rest portion. The overshoot as the ramp restores to the rest portion can ring and momentarily cross the fixed or variable reference level, thereby causing the comparator to sense a coincidence and falsely trigger the flip-flop during the rest portion before the ramp portion even begins. The variable reference such as supplied by a digital to analog converter (DAC) can also overshoot and ring sufficiently to cross the rest portion of the ramp signal and also falsely trigger the comparator and associated flip-flop. With one or both of the pulse edges subject to false triggering the accuracy and reliability of the system is always suspect.

SUMMARY OF INVENTION

It is therefore an object of this invention to provide an anti-false triggering system for a pulse width modulation system.

It is a further object of this invention to provide such an anti-false triggering system which is simple and requires no additional components or circuitry.

It is a further object of this invention to provide such an anti-false triggering system which prevents any false triggering of the pulse generation circuits during the rest portion of the ramp signal and assures that pulse generation can only occur during the ramp portion of the ramp signal.

This invention features an anti-false triggering system for a pulse width modulation system. There is a ramp generator means for generating a ramp signal having a ramp portion and a rest portion, and latch enable signal generating means for providing a latch enable signal only during the ramp portion of the ramp signal. A pulse edge modulation means responsive to the ramp portion of the ramp signal and the variable and fixed reference means provides a pulse with at least one of its edges modulated. The pulse edge modulation means is enabled by latch enable signal only during the ramp portion of the ramp signal, for suppressing false triggering of the pulse edge modulation means during the rest portion of the ramp signal.

In a preferred embodiment the pulse edge modulation means may include a digital to analog converter for providing at least one of a variable leading edge and trailing edge reference, and fixed reference means for providing a fixed reference associated with each of the variable references. The pulse edge modulation means may include means for generating edge modulation and pulse generating means responsive to the means for generating edge modulation, and enabled by the latch signal for producing an edge modulated pulse only during the ramp portion of the ramp signal. The means for generating edge modulation may include first means for generating leading edge modulation, second means for generating trailing edge modulation, and third means, responsive to the first and second means for generating, for generating dual-edge modulation. The first means for generating may include first comparator means for defining the variable leading edge and fixed trailing edge for leading edge modulation. The second means for generating may include second comparator means for defining the variable trailing edge and fixed leading edge for trailing edge modulation. The pulse generating means may include a first pulse generator responsive to the first comparator means for generating a leading edge modulated pulse; a second pulse generator responsive to the second comparator means for generating a trailing edge modulated pulse; and the third means for generating may include a third pulse generator responsive to the first and second comparator means for generating a dual-edge modulated pulse.

The invention also features an anti-false triggering system for a pulse width modulation system in a ramp generator which generates a number of ramps each having a ramp portion and a rest portion. There are latch enable signal generating means for providing latch enable signals only during the ramp portions of the ramp signals. Pulse edge modulation means produce an alternating like number of sequential pulses. The pulse edge modulation means is responsive to the ramp portions of the ramp signals for providing pulses with at least one edge modulated. The pulse edge modulation means are enabled by the latch enable signal only during the ramp portion of the ramp signals, in order to suppress false triggering of the pulse edge modulation means during the rest portions of the ramp signals.

In a preferred embodiment the pulse edge modulation means may include a like number of digital to analog converters each providing at least one of a variable leading edge and trailing edge reference, and fixed reference means for providing a fixed reference associated with each of the variable references. The number of ramps may typically be two.

DISCLOSURE OF PREFERRED EMBODIMENT

Other objects, features and advantages will occur to those skilled in the art from the following description of a preferred embodiment and the accompanying drawings, in which.

Figure 1:
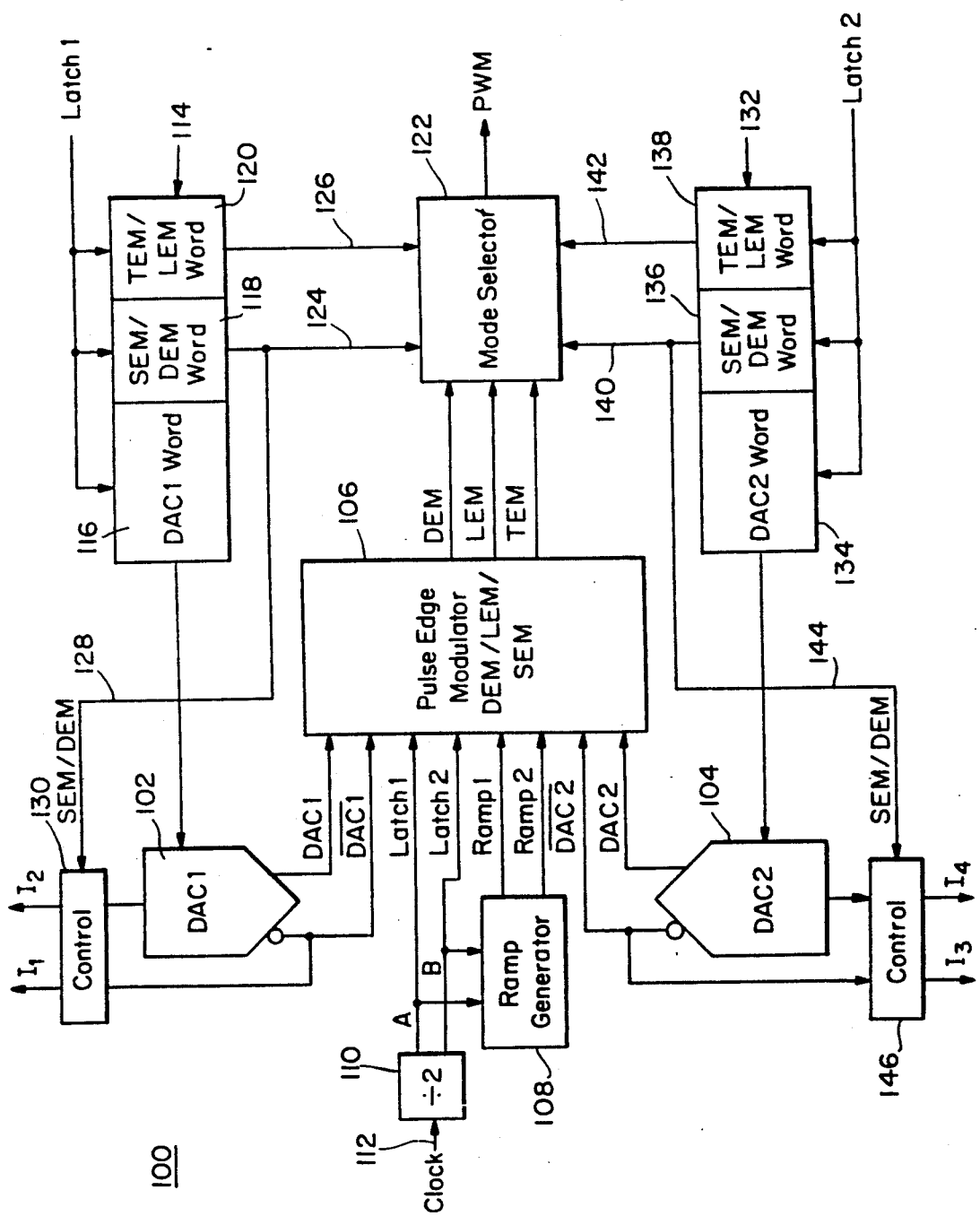
FIG. 1 is a block diagram of a high-speed pulse width modulation system using duplicate ramp generators, digital to analog converters, and control circuits to provide odd and even pulses during both halves of each clock cycle.
Figure 3A:
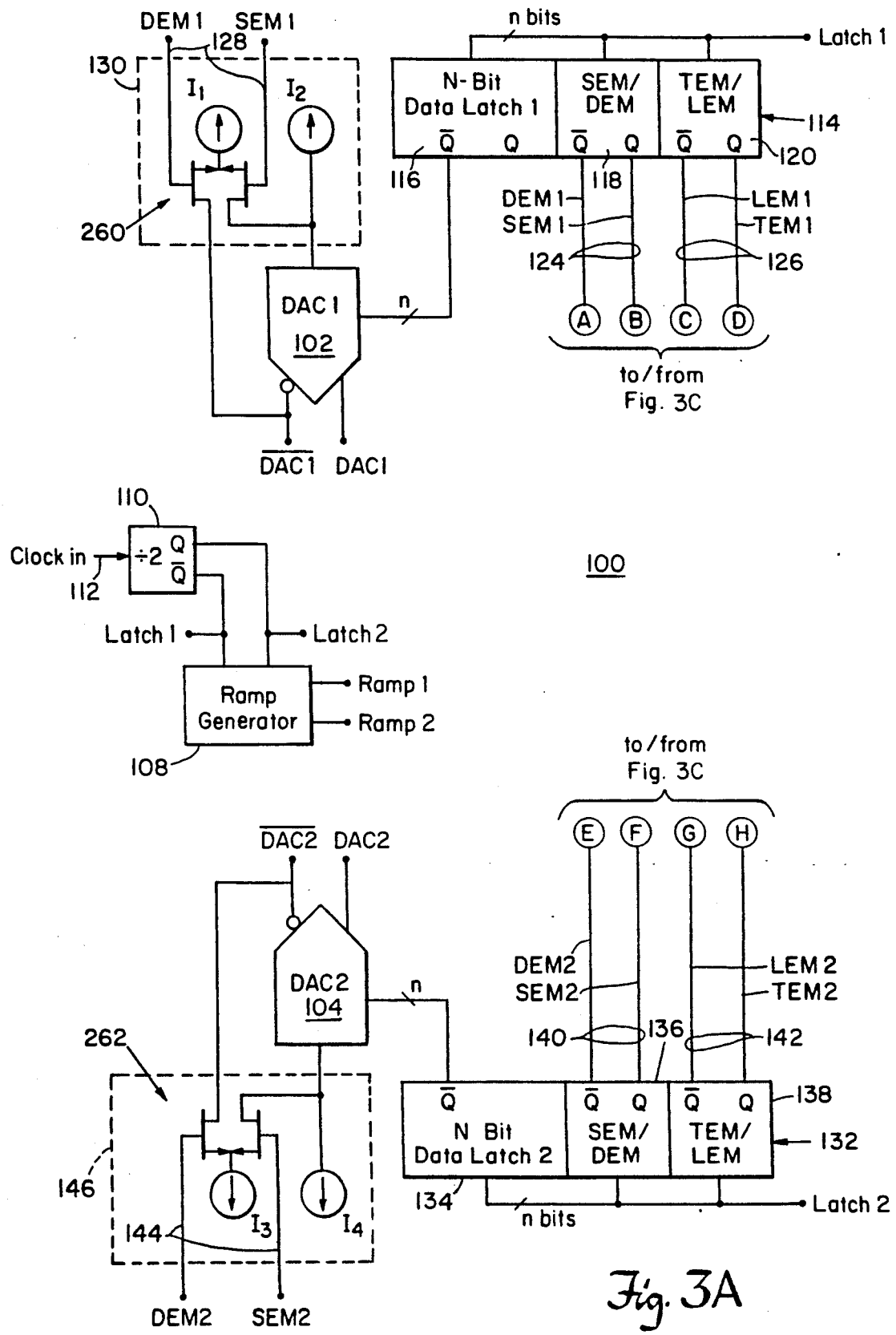
Figure 3B:
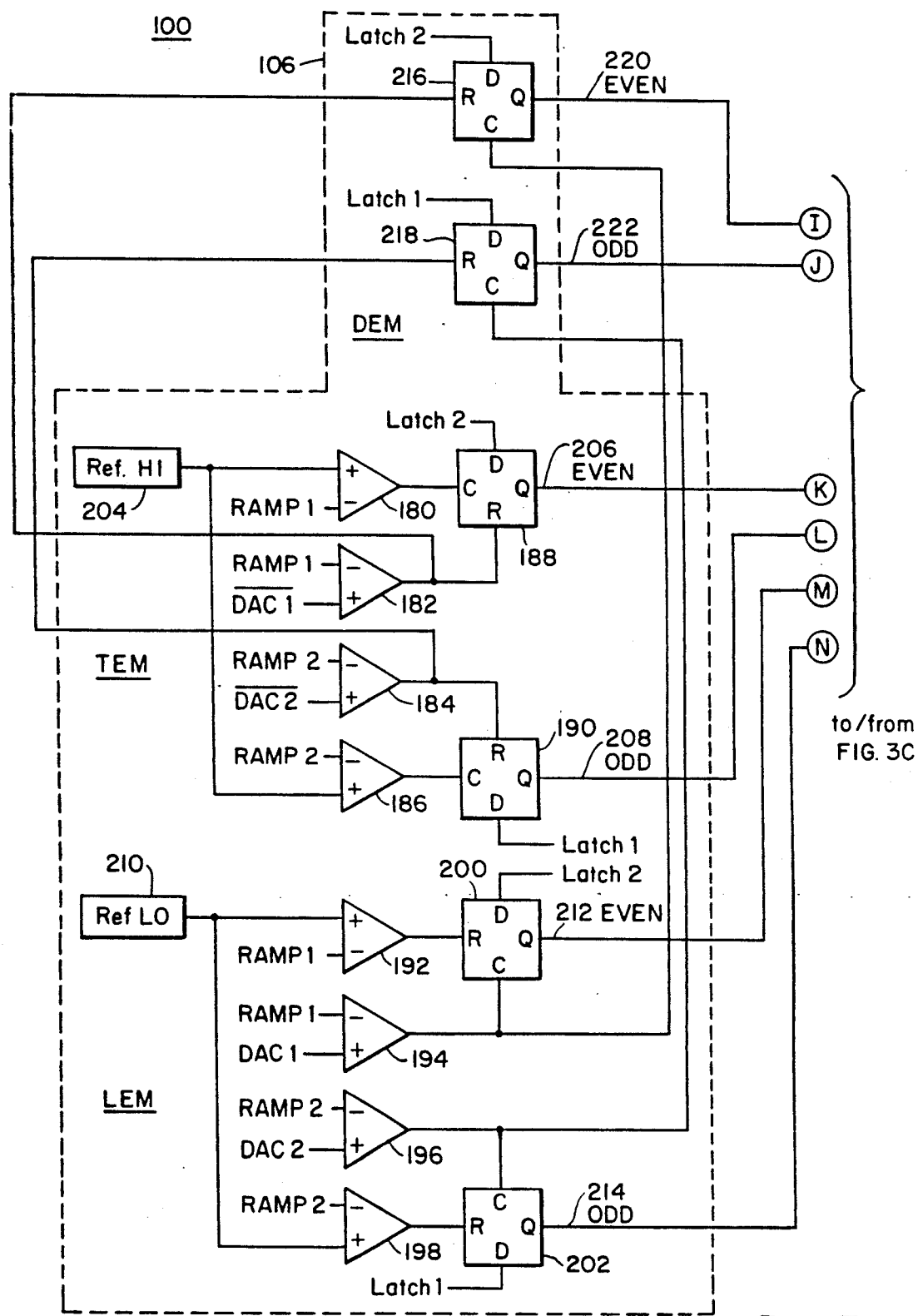
Figure 3C:
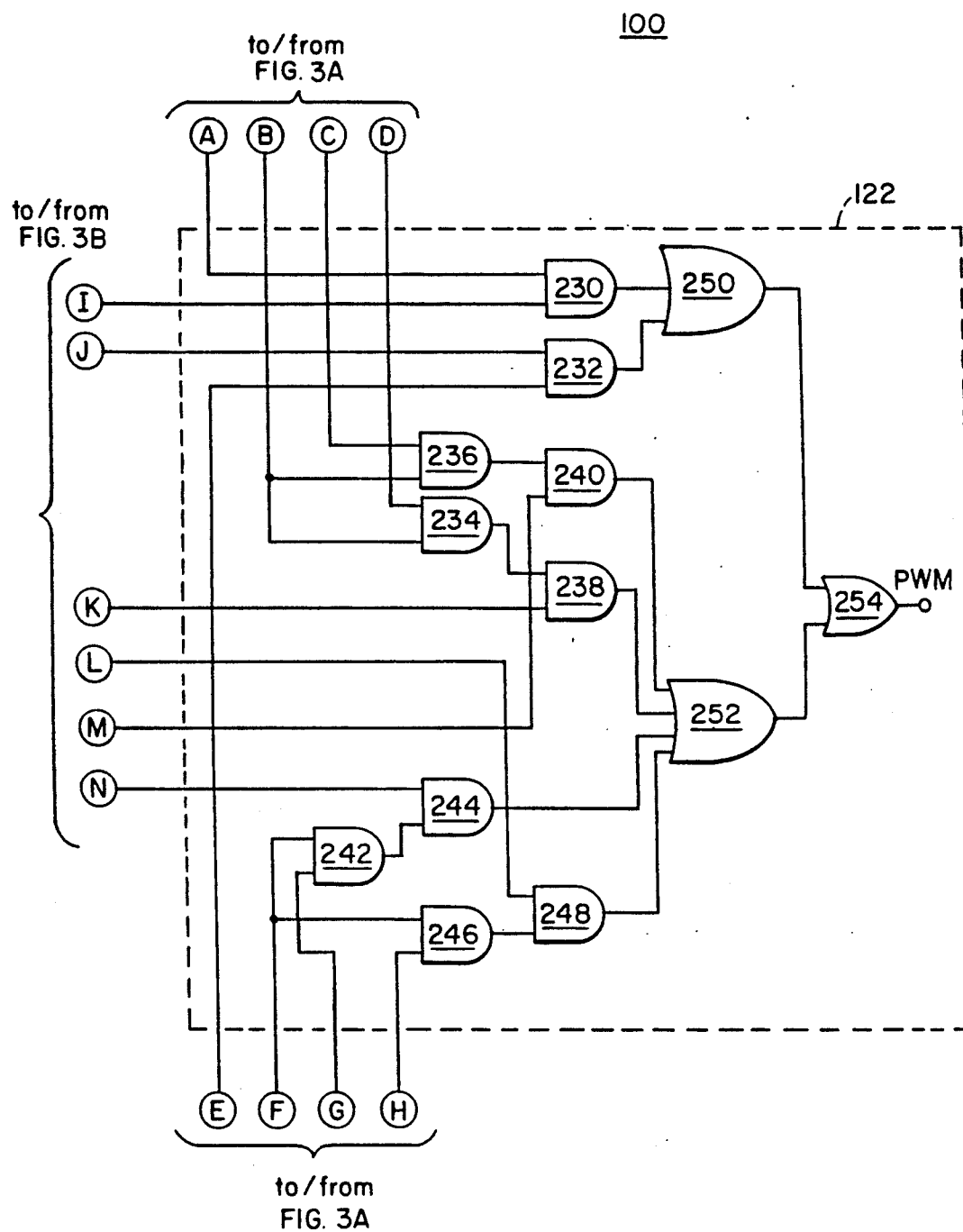
Figure 4:
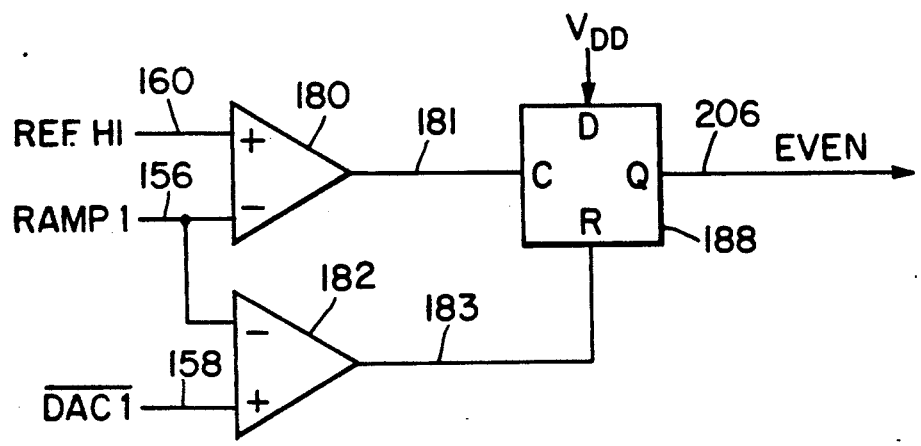
Figure 5:
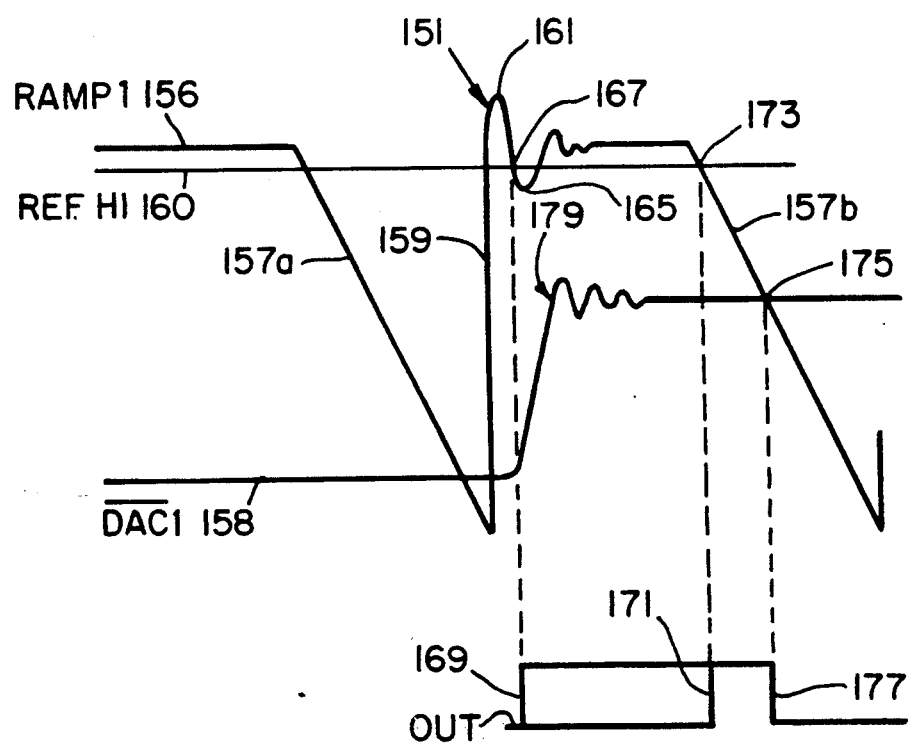

FIG. 3A–3C together form a more detailed diagram of the system of FIG. 1;

FIG. 4 is an enlarged schematic diagram of a portion of the pulse edge modulator of FIG. 3 without the anti-false triggering provision shown in FIG. 3; and FIG. 5 is an illustration of the ramp waveform with fixed and variable references for generating a trailing edge modulated pulse illustrating the false triggering that can occur.

This invention may be accomplished in an anti-false triggering system for a pulse width modulation system using a ramp generator for generating a ramp signal having a ramp portion and a rest portion. A variable reference means such as a digital to analog converter (DAC) provides at least one variable edge reference, either a leading edge reference or a trailing edge reference, or both. The fixed reference means, for example a stable source of voltage, provides a fixed reference associated with each of the variable references. There are latch enable signal generating means typically driven from an external clock signal which provides a latch enable signal only during the ramp portion of the ramp signal. Pulse edge modulation means responsive to the ramp portion of the ramp signal and to the variable and fixed reference means provides a pulse with at least one of its edges modulated. The pulse edge modulation means is enabled by the latch enable signal only during the ramp portion of the ramp signal. In this way, false triggering of the pulse edge modulation means during the rest portions of the ramp signal are prevented.

In one implementation the pulse edge modulation means includes comparators for defining the leading and lagging edge of the pulse. The output from the comparators switch on and off a latch or flip-flop which actually produces the pulse. In keeping with this invention, the flip-flop, instead of being enabled by a steady bias voltage, is enabled by a latch signal which is only present during the period of the ramp portion of the ramp signal so that the flip-flop or latch can only be operated during the period of that ramp portion. Thus no spurious signals, no false triggering, can occur during the rest portion of the ramp signal. For high-speed applications the system contains duplicate structures for providing alternate pulses denoted as odd and even. That is, two ramp signals are used so that while one ramp signal is transitioning through its ramp portion the other is going through its rest portion, and thus an alternating sequence of pulses can be generated.

There is shown in FIG. 1 a pulse width modulation system 100 that incorporates the anti-false triggering system according to this invention. In a high-speed pulse width modulation system 100, FIG. 1, analog to digital converters 102 and 104 are used in conjunction with a pulse edge modulator 106 which is capable of generating any one of the three modes DEM, LEM or TEM, so that all the pulses denominated odd and even can be generated sequentially during each half of the divide by two clock signal. Pulse edge modulator 106 receives the DAC1 and $\overline{DAC1}$ output from digital to analog converter 102, the DAC2 and $\overline{DAC2}$ outputs from digital to analog converter 104; and the two ramps, ramp 1 and ramp 2, from ramp generator 108 driven by divide by two circuit 110, which is enabled by the incoming clock signal on line 112. Pulse edge modulator 106 also receives latch 1 and latch 2 signals from the divide by two circuit 110. Latch circuit or register 114 is enabled by latch 1 to receive n bit DAC word 116. The n bit DAC word 116 causes converter 102 to establish the levels of DAC1 and $\overline{DAC1}$. Latch 1 also causes to be loaded in register 114 the SEM/DEM word 118, which indicates whether a single-edge modulation (SEM) or dual edge modulation (DEM) is requested for the next pulse. At the same time, latch 1 causes the TEM/LEM word 120 to be loaded in register 114 to indicate which of the single edge modulation modes is selected if a single edge modulation has been requested by the SEM/DEM word 118. Thus while pulse edge modulator 106 is generating all three modes of modulation, DEM, LEM and TEM, only one will be selected by mode selector 122 in response to the SEM/DEM word input on line 124 and the TEM/LEM word input on line 126. The SEM/DEM word 118 is also provided over line 128 to control 130. If SEM/DEM word 118 indicates single-edge modulation, then control 130 directs both currents $I_1$ and $I_2$ through converter 102. If SEM/DEM word 118 indicates dual edge modulation, then only the operating current $I_2$ is established through DAC1 and the bias current $I_1$ is drawn through $\overline{DAC1}$. Converter 104 is similarly served by register 132 which contains DAC2 word 134, SEM/DEM word 136 and TEM/LEM word 138, all responsive to the latch 2 signal. SEM/DEM word 136 and TEM/LEM word 138 provide indications on lines 140 and 142 to mode selector 122 in the same manner as associated with register 114. Mode selector 122 under direction from registers 114, 132 selects the mode DEM, TEM, LEM to be outputted and may be considered as including registers 114 and 132. SEM/DEM word 136 provides an indication on line 144 to control circuit 146 which controls the operating current $I_4$ and biasing current $I_3$ for converter 104 in the same way as control 130 does with respect to converter 102.

Figure 2:
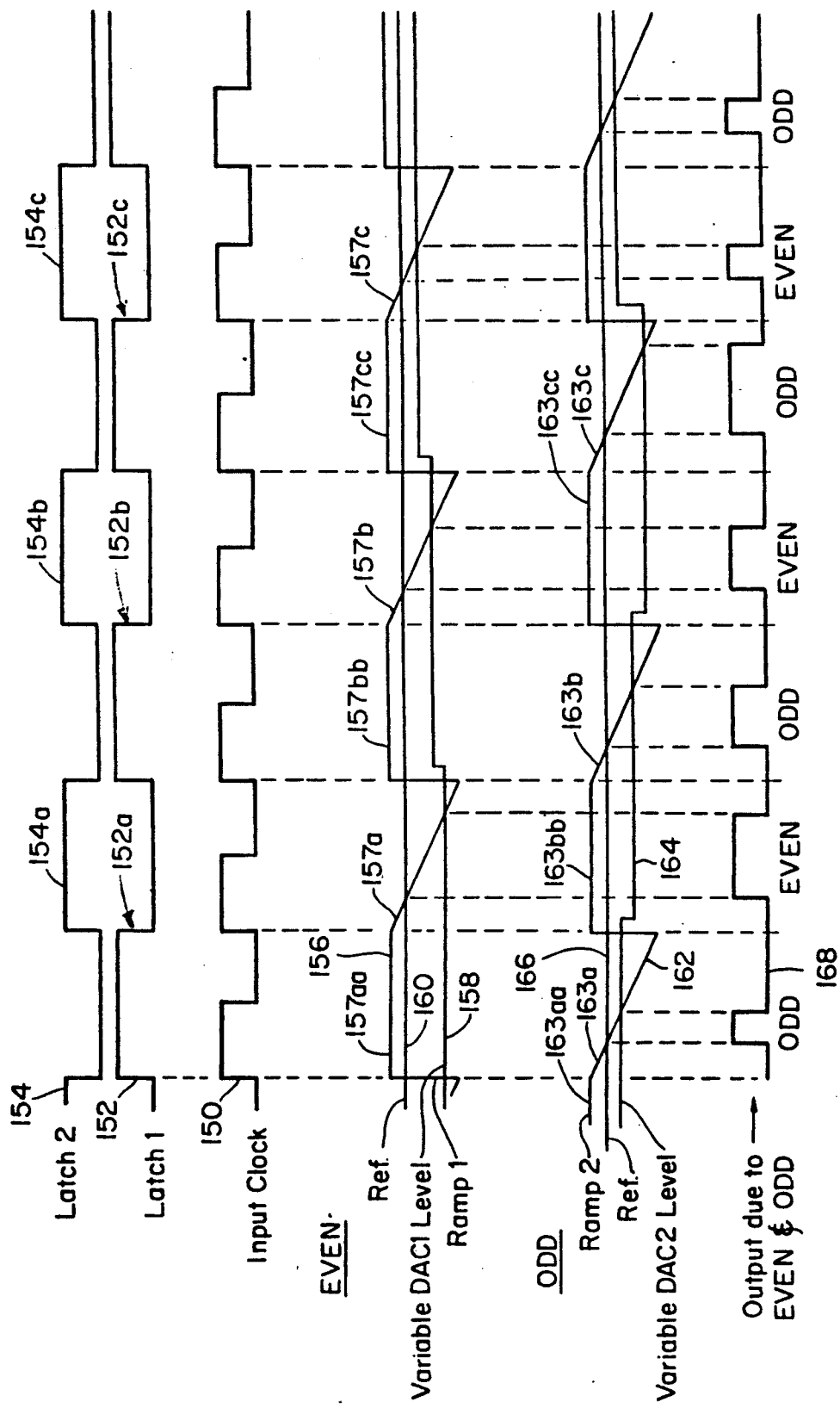
FIG. 2 is an illustration of the waveforms generated in the circuit of FIG. 1 when using two ramps to generate odd and even pulses.

The various signals occurring in FIG. 1 are shown in FIG. 2. The input clock 150 which appears on line 112 is used to generate latch 1 signal 152 and latch 2 signal 154 during alternate halves of the divide by two input clock cycle. For a simple generation of trailing edge modulated pulses, the even pulses are generated by ramp 1 156 in conjunction with the variable DAC1 level 158 and a fixed reference level 160 which may be supplied externally or generated internally of pulse edge modulator 106. Ramp 1 156 includes ramp portions 157a, b, c and rest portions 157aa, bb, cc. The odd pulses are generated using ramp 2 162 in conjunction with the variable DAC2 level 164 and reference 166. Ramp 2 162 includes ramp portions 163a, b, c and rest portions 163aa, bb, cc. The resulting series of pulse width modulated pulses is indicated at the series of waveforms labelled 168. Latch 1 is loaded when ramp 2 is active and latch 2 is loaded when ramp 1 is active. Latch 1 drives ramp 2 and latch 2 drives ramp 1.

Thus latch 2 154 is only high at times 154a, 154b, 154c coincident with the occurrence of ramp portion 157a, 157b, and 157c, respectively, and the latch 1 signal 152 is only high at times 152a, 152b, and 152c coincident with the occurrence of the ramp portion 163a, 163b and 163c.

The pulse edge modulator 106 and mode selector 122 of system 100 are shown in greater detail in FIGS. 3A–3C. Pulse edge modulator 106 includes two sets of four comparators. The upper set of comparators 180, 182, 184 and 186 are used in conjunction with flip-flops or latches 188 and 190 to generate trailing edge modulation (TEM). The lower four comparators 192, 194, 196 and 198 are used in conjunction with latches or flip-flops 200 and 202 to generate leading edge modulation (LEM). Comparator 180 compares the reference input from high reference circuit 204 and ramp 1 to set flip-flop 188 at its input C to establish the fixed leading edge of a TEM pulse. Flip-flop 188 is reset at its input R to define the variable trailing edge of the TEM pulse by the output from comparator 182 which responds to ramp 1 and to the $\overline{DAC1}$ input. The Q output of flip-flop 188 on line 206 thus produces the even pulse in the odd-even set. Flip-flop 188 is enabled to produce such a pulse only during the latch 2 period when the latch 2 signal is present at the D input. The odd pulse for the DEM is produced by flip-flop 190 on line 208 during the latch 1 period when the latch 1 signal is present at the D input to flip-flop 190 and flip-flop 190 is set by comparator 186 which responds to the high reference from reference circuit 204 and ramp 2. Flip-flop 190 is reset by comparator 184 which responds to the ramp 2 and the $\overline{DAC2}$ signal.

Comparator 194 responds to the ramp 1 and DAC1 signals to set flip-flop 200 and define the variable leading edge of the even pulse while comparator 192 responds to the low reference level from low reference circuit 210 and ramp 1 to reset flip-flop 200 and thereby define the even LEM pulse on line 212. Comparator 196 responds to ramp 2 and DAC 2 to set flip-flop 202 defining the variable leading edge of the pulse produced by flip-flop 202 on line 214. This odd pulse on line 214 occurs during the period while flip-flop 202 is enabled.

For dual edge modulation, even latch 216 and odd latch 218 are used. Even latch 216 is set by the output from comparator 194 and reset by the output from comparator 182 to define the variable positions of the leading and the trailing edge of the even pulse provided on line 220. Latch 218 is set by the output of comparator 196 and reset by the output of comparator 184 to define the variable leading and trailing edges of the DEM odd pulse on line 222. In this way, only two ramps are used to constantly generate all three modes of modulation which can be selected in any mix of modes: that is, LEM, TEM and DEM can be selected in any order for even and/or odd pulses, and since they are always present, no synchronization problems occur when one of them is selected by mode selector 122. Pulse edge modulator 106 may be considered as including DACs 102, 104, registers 114, 132, and controls 130, 146.

Mode selector 122 includes two AND gates 230 and 232 associated with DEM latches 216, 218, four AND gates 234, 238, 246 and 248 associated with TEM latches 188 and 190, and four AND gates 242, 244, 236 and 240 associated with LEM latches 200 and 202. These AND gates feed two OR gates 250 and 252 which feed the final OR gate 254. AND gate 230 is enabled to pass the even pulse on line 220 when the $\overline{Q}$ output is high from word 118 in register 114, indicating that dual edge modulation and not single edge modulation has been chosen. Similarly, AND gate 232 is enabled to pass the odd pulse on line 222 when the $\overline{Q}$ pulse is high in word 136 of register 132. If either one of these AND gates is enabled, then their respective odd or even pulse will be passed to OR gate 250 and on to output OR gate 254.

If in contrast the Q output of SEM/DEM word 118 in register 114 is enabled, then one output is provided to each of AND gates 234 and 236. One of these two AND gates is then enabled depending upon whether the $\overline{Q}$ LEM1, or $\overline{Q}$ TEM1 outputs of word 120 are high in register 114. If AND gate 236 is enabled, it in turn enables AND gate 240 to pass the even pulse on line 212. If instead AND gate 234 is enabled, then it enables AND gate 238 to pass the even pulse on line 206. In either case, one of those pulses reaches OR gate 252 and is passed to the final output OR gate 254.

In a similar manner, the Q outputs from word 136 in register 132 provide one output to each of AND gates 242 and 246 depending upon whether the $\overline{Q}$ LEM2 output or the Q TEM2 output is high. One of those two gates 242 or 246 will have an output. If 242 has an output it enables AND gate 244 to pass the odd pulse on line 214. If AND gate 246 has an output it enables AND gate 248 to pass the odd pulse on line 208. In either case one of the signals is presented at OR gate 252 from where it is delivered to output OR gate 254.

The switching function of control 130 may be implemented using a differential switch 260. A SEMI signal causes $I_1$ to be paralleled with $12_1$. A DEMI output causes $I_1$ to be established with the $\overline{DAC1}$ output of converter 102. In a similar manner, differential switch 262 in control 146 associated with converter 104 operates to control the path of current $I_3$.

Thus the anti-false triggering system which includes ramp generator 108 and latches or flip-flops 216, 218 in the DEM circuit, latches 188 and 190 in the TEM circuit, and latches 200 and 202 in the LEM circuit, functions to prevent any triggering when the associated ramp signal is not undergoing its ramp portion. That is, the latch 2 signal 154a, 154b, 154c, FIG. 2, operates flip-flop 216 to provide the even DEM pulse, operates flip-flop 188 to produce the even TEM pulse, and operates flip-flop 200 to produce the even LEM pulse, only during the occurrence of ramp portion 157a, 157b, 157c of ramp 1 156, FIG. 2. Similarly, latch 1 only enables flip-flop 218 to produce the odd DEM pulse, flip-flop 190 to produce the odd TEM pulse, and flip-flop 202 to produce the odd LEM pulse during the occurrence of ramp portion 163a, 163b, 163c of ramp 2 signal 162, FIG. 2.

The prevention of false triggering can be better understood with reference to FIG. 4, where an enlarged view of comparators 180 and 182 and their associated flip-flop 188 are shown, with flip-flop 188 receiving a steady enabling voltage $V_{DD}$ at its D input. This means that flip-flop 188 is ever-ready to respond to a trigger pulse on line 181 from comparator 180, or a reset pulse on line 183 from comparator 182. With this arrangement, when ramp signal 156, FIG. 5, restores along vertical line 159 from ramp portion 157a to rest portion 157bb, it may overshoot high reference 160, reaching a level 161 and then plunging down to a point 165 below high reference 160, which will cause an output from comparator 180 that will set flip-flop 188. This occurs at point 167, where the ringing signal 151 crosses high reference 160. This falsely starts the pulse at 169, whereas for example it should be starting at 171 coincident with the crossing at 173 of high reference 160 with ramp portion 157b. In this TEM mode the trailing edge is determined by the intersection of the variable reference, $\overline{DAC1}$ 158, at point 175 so that the pulse ends at point 177. A similar problem can occur in LEM modulation when the DACI signal overshoots the rest portion 157bb of ramp signal 156, causing comparator 194 to trigger flip-flop 200. In FIG. 5 that overshoot 179 is present but is not shown large enough to intersect the rest portion of ramp signal 156 in order to avoid confusion in the drawing with respect to ring signal 151.

Although specific features of the invention are shown in some drawings and not others, this is for convenience only as each feature may be combined with any or all of the other features in accordance with the invention.

Other embodiments will occur to those skilled In the art and are Within the following claims:

What is claimed is:

1. An anti-false triggering system for a pulse width modulation system, comprising:
   ramp generator means for generating a ramp signal having a ramp portion and a rest portion;
   latch enable signal generating means for providing a latch enable signal only during the ramp portion of said ramp signal; and
   pulse edge modulation means, responsive to said ramp portion of said ramp signal, for providing a pulse with at least one of its edges modulated, said pulse edge modulation means being enabled by said latch enable signal only during the ramp portion of said ramp signal for suppressing false triggering of said pulse edge modulation means during said rest portion of said ramp signal.

2. The anti-false triggering system for a pulse width modulation system of claim 1 in which said pulse edge modulation means includes a digital to analog converter for providing at least one of a variable leading edge reference and trailing edge reference.

3. The anti-false triggering system for a pulse width modulation system of claim 1 in which said pulse edge modulation means includes means for generating edge modulation and pulse generating means responsive to said means for generating edge modulation and enabled by said latch enable signal for producing an edge modulated pulse only during the ramp portion of the ramp signal.

4. The anti-false triggering system for a pulse width modulation system of claim 3 in which said means for generating edge modulation includes first means for generating leading edge modulation, second means for generating trailing edge modulation and third means, responsive to said first and second means for generating, for generating dual-edge modulation.

5. The anti-false triggering system for a pulse width modulation system of claim 4 in which said first means for generating includes first comparator means for defining the variable leading edge and fixed trailing edge for leading edge modulation, and said second means for generating includes second comparator means for defining the variable trailing edge and fixed leading edge for trailing edge modulation.

6. The anti-false triggering system for a pulse width modulation system of claim 5 in which said pulse generating means includes a first pulse generator responsive to said first comparator means for generating a leading edge modulated pulse, a second pulse generator responsive to said second comparator means for generating a trailing edge modulated pulse, and a third pulse generator responsive to said first and second comparator means for generating a dualedge modulated pulse.

7. An anti-false triggering system for a pulse width modulation system, comprising:
   ramp generator means for generating a number of ramp signals each having a ramp portion and a rest portion;
   latch enable signal generating means for providing latch enable signals only during the ramp portions of said ramp signals; and
   pulse edge modulation means, for producing an alternating, like number of segmented pulses, said pulse edge modulation means being responsive to said ramp portions of said ramp signals for providing pulses with at least one edge modulated, said pulse edge modulation means being enabled by said latch enable signals only during the ramp portions of said ramp signals for suppressing false triggering of said pulse edge modulation means during said rest portion of said ramp signals.

8. The anti-false triggering system for a pulse width modulation system of claim 7 in which said pulse edge modulation means includes a like number of digital to analog converters each providing at least one of a variable leading edge and trailing edge reference.

9. The anti-false triggering system for a pulse width modulation system of claim 8 in which said pulse edge modulation means includes means for generating edge modulation and pulse generating means responsive to said means for generating edge modulation and enabled by a said latch enables signals for producing edge modulated pulse only during the ramp portion of the ramp signals.

10. The anti-false triggering system for a pulse width modulation system of claim 9 in which said means for generating edge modulation includes first means for generating leading edge modulation, second means for generating trailing edge modulation and third means, responsive to said first and second means for generating, for generating dual-edge modulation.

11. The anti-false triggering system for a pulse width modulation system of claim 10 in which said first means for generating includes first comparator means for defining the variable leading edge and fixed trailing edge for leading edge modulation, and said second means for generating includes second comparator means for defining the variable trailing edge and fixed leading edge for trailing edge modulation.

12. The anti-false triggering system for a pulse width modulation system of claim 11 in which said pulse generating means includes a first pulse generator responsive to said first comparator means for generating a leading edge modulated pulse, a second pulse generator responsive to said second comparator means for generating a trailing edge modulated pulse, and a third pulse generator responsive to said first and second comparator means for generating a dualedge modulated pulse.

13. The anti-false triggering system for a pulse width modulation system of claim 7 in which the number of ramp signals is two.

* * * * *